United States Patent
Leonhardt et al.

(10) Patent No.: US 12,356,641 B2
(45) Date of Patent: Jul. 8, 2025

(54) METHOD OF MANUFACTURING METAL-INSULATOR-METAL (MIM) CAPACITORS WITH NOBLE METAL ELECTRODE LINERS

(71) Applicant: ASM IP Holding B.V., Almere (NL)

(72) Inventors: Alessandra Leonhardt, Helsinki (FI); Michael Givens, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 387 days.

(21) Appl. No.: 17/850,087

(22) Filed: Jun. 27, 2022

(65) Prior Publication Data
US 2023/0006031 A1 Jan. 5, 2023

Related U.S. Application Data

(60) Provisional application No. 63/216,627, filed on Jun. 30, 2021.

(51) Int. Cl.
*H10D 1/68* (2025.01)
*H01L 21/02* (2006.01)
*H01L 21/285* (2006.01)

(52) U.S. Cl.
CPC ....... *H10D 1/692* (2025.01); *H01L 21/02181* (2013.01); *H01L 21/02189* (2013.01); *H01L 21/02194* (2013.01); *H01L 21/2855* (2013.01); *H01L 21/28556* (2013.01)

(58) Field of Classification Search
CPC ............... H01L 28/60; H01L 21/02181; H01L 21/02189; H01L 21/02194; H01L 21/2855; H01L 21/28556; H10D 1/692
See application file for complete search history.

(56) References Cited

U.S. PATENT DOCUMENTS

| | | | |
|---|---|---|---|
| 8,828,821 B2 * | 9/2014 | Chen | H01L 28/65 438/238 |
| 2014/0187018 A1* | 7/2014 | Malhotra | H01L 28/56 438/396 |
| 2015/0137315 A1 | 5/2015 | Chen et al. | |

OTHER PUBLICATIONS

Popovici et al. "High-performance (EOT<0.4nm, Jg~10-7A/cm2) ALD-deposited Ru\SrTiO3 stack for next generations DRAM pillar capacitor"; IEEE; 4pp.

Cheng et al. "Improved High-Temperature Leakage in High-Density MIM Capacitors by Using a TiLaO Dielectric and an Ir Electrode"; IEEE Electron Device Letters, vol. 28, No. 12, Dec. 2007; 3pp.

Titta, et al. "Atomic layer deposition of noble metals: Exploration of the low limit of the deposition temperature." Journal of materials research 19.11 (2004): 3353-3358.

* cited by examiner

*Primary Examiner* — Richard A Booth
(74) *Attorney, Agent, or Firm* — Snell & Wilmer L.L.P.

(57) ABSTRACT

A noble metal liner and a metal-insulator-metal (MIM) capacitor (MIMCAP) are described along with the methods of manufacture or fabrication. The MIM capacitor includes a liner formed of a thin layer or film of a noble metal, which is only a few nanometers thick, e.g., a thickness in the range of about 0.5 nm to about 5 nm or more. In a finished device such as a MIM capacitor, the noble metal liner is sandwiched between a thicker electrode and the insulator, e.g., a layer or thin film of high or ultra high-k material, thereby providing a cap for the electrode to limit leakage currents in the device.

11 Claims, 5 Drawing Sheets

METHOD OF MANUFACTURING METAL-INSULATOR-METAL (MIM) CAPACITORS WITH NOBLE METAL ELECTRODE LINERS

CROSS-REFERENCE TO RELATED APPLICATIONS

This application claims priority to U.S. Provisional Patent Application Ser. No. 63/216,627 filed Jun. 30, 2021, titled METHOD OF MANUFACTURING METAL-INSULATOR-METAL (MIM) CAPACITORS WITH NOBLE METAL ELECTRODE LINERS, the disclosure of which is hereby incorporated by reference in its entirety.

FIELD OF THE DISCLOSURE

The present disclosure relates generally to design and manufacture of capacitors for use in electronics including in memory devices such as DRAM (Dynamic Random Access Memory), SRAM (Static Random Access Memory), and the like, and, more particularly, to manufacture of liners for electronic devices and to manufacture of metal-insulator-metal (MIM) capacitors (often labeled "MIMCAPS") with enhanced leakage current characteristics for use in memory and other electronic or computer devices.

BACKGROUND OF THE DISCLOSURE

DRAM and other memory devices utilize capacitors to store bits of information within an integrated circuit, and, in brief, a capacitor is formed by placing a dielectric material between two electrodes formed of conductive materials. With reductions in sizes, DRAM devices often use MIM capacitors in which the electrode materials are metals. These electrode materials generally have higher conductivities than other electrode materials such as semiconductors and also have various work functions, have improved stability, and exhibit reduced depletion effects.

The electrode materials are chosen to have high conductivity to ensure fast device speeds, and MIMs also typically utilize insulating materials having a dielectric constant or k-value much higher than that of SiO2, with such dielectric materials being classified as high-k materials. Unfortunately, increasing the k-value can decrease the conduction band offset with respect to the metal electrode, which can lead to unwanted leakage current for a MIM device especially at high temperatures.

There remains a demand for MIM capacitor designs for use in DRAM and other devices with reduced leakage current. To this end, the electrodes have a strong impact in the leakage conduction in MIM capacitors. For example, electrodes can influence leakage currents in the following ways: (a) by directly injecting electrons over the conduction band of the dielectric materials, if the energy difference between the conduction band of the dielectric and the work function of the metal is too small; and (b) by scavenging oxygen from the dielectric materials, which generates oxygen vacancies and, thus, increases the trap density.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In brief, a new metal-insulator-metal (MIM) capacitor (MIMCAP) is described herein along with its method of manufacture or fabrication. The MIM capacitor includes a liner formed of a thin layer or film of a noble metal, which is only a few nanometers (nm) thick (e.g., a thickness in the range of about 0.5 nm to about 5 nm or more). In a finished device (e.g., a MIM capacitor), the noble metal liner is sandwiched between a thicker electrode and the insulator (e.g., a layer or thin film of high or ultra high-k material) so as to provide an interface layer between the electrode(s) and dielectric to limit leakage currents in the device.

Disclosed herein, according to various embodiments, is a method of fabricating a semiconductor stack for use in metal-insulator-metal (MIM) capacitors. The method may include providing a substrate and forming an electrode layer by depositing a layer of a conductive material (e.g., a metal) on the substrate. The method may further include, after the forming of the electrode layer, depositing a layer of a noble metal over the electrode layer, and then, after the deposition of the layer of the noble metal, forming a dielectric layer on the layer of the noble metal, whereby a liner is formed that is sandwiched between the electrode layer and the dielectric layer.

In some exemplary embodiments, the layer of the noble metal has a thickness of less than or equal to 5 nanometers (nm), e.g., in the range of about 0.5 to about 5 nm. To form the stack, the noble metal may be iridium (Ir), ruthenium (Ru), or platinum (Pt). The dielectric layer may take the form of a layer of a high-k or ultra-high-k dielectric material, with some useful examples providing the layer of a high-k or ultra-high-k dielectric material so that it includes at least one of hafnium oxide ($HfO_2$), doped $HfO_2$, hafnium zirconium oxide (HfZrO), and doped HfZrO. In these or other embodiments of the method, the conductive material may be a conductive metal, a conductive metal oxide, a conductive metal silicide, a conductive metal nitrides, or a combination thereof, with one useful implementation utilizing a conductive material including titanium nitride.

To perform the method, the depositing of the layer of the noble metal may be performed using a cyclical deposition process including a plurality of cycles. In this cyclical deposition process, each of the cycles may include a precursor pulse and a reactant pulse, and the precursor pulse may involve exposing the electrode layer to a precursor while the reactant pulse may involve exposing the electrode layer to a reactant. This cyclical processing may be performed using atomic layer deposition (ALD) in some cases. This method or processing may be used to form a liner for MIM or other electrodes or electrode layers, with or without performance of the other stack fabrication steps discussed herein.

The semiconductor stack may be formed with additional layers in some embodiments. Hence, the method may further include forming a second liner by depositing a layer of a second noble metal on a surface of dielectric layer opposite the first liner. Then, the method may include the step of forming a second electrode layer by depositing a layer of a second conductive material (e.g., a metal) on a surface of the second liner opposite the dielectric layer. In some embodiments, the first noble metal differs from the second noble metal, while other embodiments may utilize matching noble metals for the two liners of the stack. In these or other embodiments, the first liner may have a first thickness and the second liner may have a second thickness differing from the first thickness or being equal (or substantially so) to the first thickness.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Figure 1:
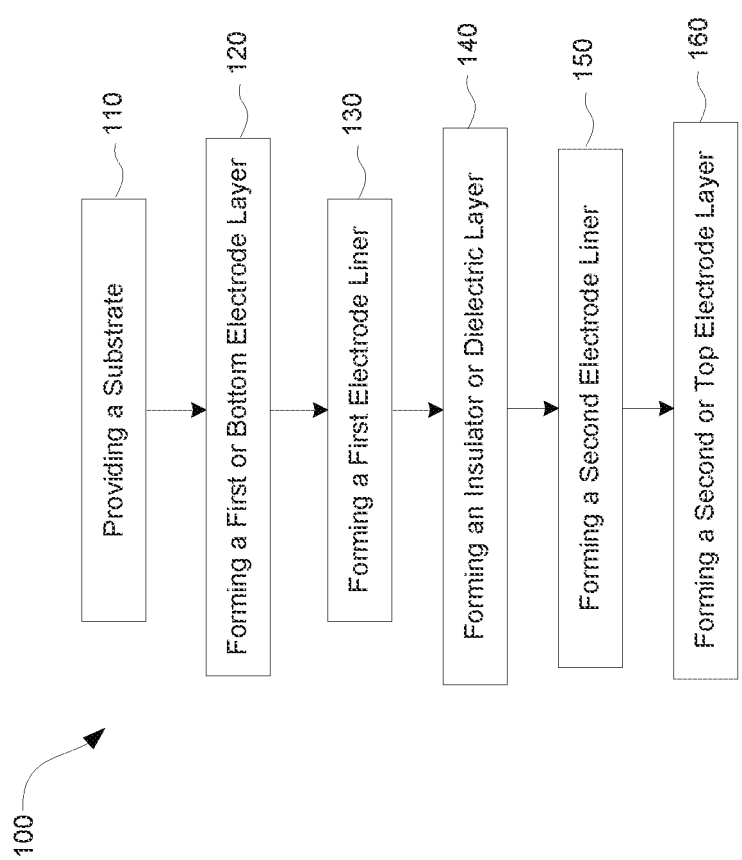
FIG. 1 is a flow diagram of a method of manufacturing or fabricating a MIM capacitor of the present description.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As described in greater detail below, various details and embodiments of the disclosure may be utilized in conjunction with a reaction chamber configured for a multitude of deposition processes, including but not limited to, ALD, CVD, metalorganic chemical vapor deposition (MOCVD), molecular beam epitaxy (MBE), physical vapor deposition (PVD), plasma-enhanced chemical vapor deposition (PECVD), and plasma etching. The embodiments of the disclosure may also be utilized in semiconductor processing systems configured for depositing (providing or forming) layers or thin films of a MIM capacitor, which are known by (or yet to be developed by) those skilled in the arts.

The inventors recognized that the electrodes of a MIM capacitor can have a strong impact on leakage conduction. Instead of replacing a whole MIM capacitor electrode with a noble metal to control leakage conduction, the inventors created a method of fabricating a MIM capacitor with a noble metal liner sandwiched between an electrode and the insulator or dielectric. The noble metal liner may be formed using PVD, ALD, or other deposition process and be formed of a material chosen due to have a high work function such as iridium (Ir), ruthenium (Ru), platinum (Pt), or other noble metal. The electrode may be formed of titanium nitride (TiN) or other metal useful in a MIM capacitor while the insulator is typically formed of a high-k or ultra-high-k dielectric (e.g., hafnium oxide ($HfO_2$), doped $HfO_2$, hafnium zirconium oxide (HfZrO), doped HfZrO, or the like).

As one useful example, the MIM capacitor may include a liner (or liners) formed of a thin film of iridium, between an electrode and the dielectric material layer. Iridium has a work function of 5.27 eV and has a low oxygen scavenging potential for a noble metal. The thin film liner may be provided at a thickness of less than or equal to 5 nm such as between about 0.5 nm and about 5 nm, which is adequate to cap the electrode material and, thus, form a scavenging barrier and alter the effective work function of the whole or capped electrode. The noble metal may be provided as a thin film over the electrode (top or bottom electrode or first and second electrode of a MIM capacitor) using any useful deposition process with PVD and ALD being desirable in some MIM capacitor fabrication applications.

The new MIM capacitors are unique, in part, due to the introduction or use of a noble metal liner instead of replacing the whole electrode with noble metal. This new design has a number of advantages. First, noble metals can be very expensive. By using a thin (e.g., 0.5 to 5 nm) liner, the cost of using a noble metal in the MIM capacitor is greatly reduced when compared to using noble metal for the bulk electrode that may have a thickness of 20 nm or more. Second, only small process modifications are required when using a liner, as opposed to larger process modifications downstream and upstream for the whole electrode replacement. For example, in the case of etching the electrodes, the electrode metal can be etched as usual, and the liner can act as an etch stop layer. Then, a short, and different in some cases, etch cycle can be used to punch through the liner. Third, the use of noble metal liners allows capacitors to be designed so as to provide work function tuning, with less leakage through direct injection of carriers. Fourth, the liners provide capacitors with less oxygen scavenging, resulting in less leakage through trap density reduction. Fifth, the use of a noble metal liner prevents the oxidation of the bottom electrode, which is a source of equivalent oxide thickness (EOT) increase.

FIG. 1 describes a method 100 for fabricating a MIM capacitor or a capacitor stack (e.g., a DRAM capacitor stack). Those skilled in the art will appreciate that each of the layers discussed herein and used in a MIM capacitor or capacitor stack may be formed using any common formation techniques such ALD (or ALD-like process or other cyclical deposition process), PVD, or CVD that are useful for deposition of thin films or layers of materials described herein. Hence, the method 100 is intended to include any useful process for depositing the layers or thin films of the MIM capacitor or capacitor stacks shown in FIGS. 2-5. The initial step 110 involves providing a substrate, which may have already received several processing steps useful in the manufacture of a full DRAM or other electronic device and may take the form of a silicon wafer or other useful substrate material(s).

The method 100 then includes at step 120 forming a first or bottom electrode layer above or on an upper surface of the substrate from step 110. In one embodiment, the electrode is formed by depositing a thin film of a metal (such as titanium nitride (TiN)) through one of the deposition processes described above. The metal layer or element providing the bottom or first electrode may be formed of other metals, conductive metal oxides, conductive metal silicides, conductive metal nitrides, and combinations thereof. The purpose of the first or bottom electrode in a MIM capacitor or another device is often to serve as a primary conductor.

The next step 130 of method 100 includes forming a thin layer or film that acts as a liner for the electrode formed in step 120 (e.g., forming an electrode liner). This may involve depositing, with PVD, ALD, or another useful deposition technology, a layer or film of a noble metal over the upper or exposed surface of the electrode from step 120.

In some implementations of the method 100, step 130 (and/or step 150) of forming the liner are completed using a cyclical deposition process including a plurality of cycles (such as, for example, ALD, an ALD-like process, or the like). Each cycle may include a precursor pulse and a reactant pulse, with the precursor pulse including exposing a substrate (e.g., the electrode for step 130 or the insulator/dielectric layer for step 150) to a precursor while the reactant pulse includes exposing the same substrate to a reactant. This may be performed using suitable high k ALD processes as such are known in the art. For example, suitable noble metal ALD processes are, as such, described in scholarly literature, e.g. Aaltonen, Titta, et al. "Atomic layer deposition of noble metals: Exploration of the low limit of the deposition temperature." Journal of materials research 19.11 (2004): 3353-3358 and the like. A number of advantageous precursor-reactant combinations may be utilized and may include one or more of: $Ir(acac)_3$, Ir(RCp)(CHD), $Pt(acac)_2$, $Pt(RCp)R_3$, $PtR_2$-hexadiene, Pt(DDAP), $Rh(acac)_3$ combined with $O_2$, $O_2+H_2$, $O_3$, O-containing plasma, and O and H-containing plasma. R can be a suitable organic radical such as hydrocarbyl, aryl, alkyl, or alkenyl. Note that Cp stands for cyclopentadienyl, CHD stands for cyclohexadiene, acac stands for acetylacetonate, and DDAP stands for dimethyl(N,N-dimethyl-3-butene-1-amine-N). Typically, subsequent pulses and subsequent cycles are separated by purges, which are common and optional. In this regard, steps 130 and 150 may be implemented using super cycle processes, in which a super cycle includes a first cycle and a second cycle and where the first and second cycles employ different precursors and/or reactants. For example, alloys, stacks, and nanolaminates (which may be formed to provide liners as these are defined herein) can be made using such super cycle processes to form alloys, stacks, nanolaminates, or combinations thereof including one or more noble metals.

The precursors utilized may be selected to suit the particular deposition process and/or step. For example, when ALD processes are used in step 130 (and/or step 150), the metal precursor may include a noble metal such as Ir, Pd, Rh or Pt. In some embodiments the noble metal can be Ru. Suitable noble metal precursors may be selected by the skilled artisan. In general, metal compounds where the metal is bound or coordinated to oxygen, nitrogen, carbon or a combination thereof are preferred. More preferably metallocene compounds, beta-diketonate compounds and acetamidinato compounds are used. In some embodiments, a cyclopentadienyl precursor compound is used, preferably a bis(ethylcyclopentadienyl) compound. More preferably betadiketonate compounds are used. In some embodiments, $X(acac)_3$ or X(thd)y compounds are used, where X is a noble metal, y is generally, but not necessarily between 2 and 3 and thd is 2,2,6,6-tetramethyl-3,5-heptanedionato and acac is 3,5-pentanedionato. In some embodiments, the noble metal precursors are organometalic compounds.

When depositing iridium thin films, preferred metal precursors may be selected from the group consisting of iridium betadiketonate compounds, iridium cyclopentadienyl compounds, iridium carbonyl compounds and combinations thereof. The iridium precursor may also comprise one or more halide ligands. In preferred embodiments, the precursor comprises Ir(thd)$_3$, (methylcyclopentadienyl)iridium(1,3-cyclohexadiene) (MeCp)Ir(CHD) or tris(acetylacetonato) iridium(III) and derivates of those.

When depositing palladium films, preferred metal precursors include bis(hexafluoroacetylacetonate)palladium(II), Pd(acac)$_2$, and bis(2,2,6,6-tetramethyl-3,5-heptanedionato) palladium(II) and derivates of those. When depositing platinum films, preferred metal precursors include (trimethyl) methylcyclopentadienylplatinum(IV), platinum(II) acetylacetonato, bis(2,2,6,6-tetramethyl-3,5-heptanedionato)platinum(II) and their derivatives. When depositing rhodium films, preferred metal precursors include rhodium(III)acetylacetonato, cyclopentadienyl compounds of Rh and derivates of those.

When depositing ruthenium thin films, preferred metal precursors may comprise a compound that is selected from the group consisting of bis(cyclopentadienyl)ruthenium, tris (2,2,6,6-tetramethyl-3,5-heptanedionato)ruthenium, 2,4-(dimethylpentadienyl) (ethylcyclopentadienyl)ruthenium (Ru [(CH$_3$)$_2$C$_5$H$_5$](EtCp)]) and tris(N, N'-diisopropylacetamidinato)ruthenium(III) and their derivatives, such as bis(N,N'-diisopropylacetamidinato)ruthenium(II) dicarbonyl, bis(ethylcyclopentadienyl)ruthenium, bis(pentamethylcyclopentadienyl)ruthenium and bis (2,2,6,6-tetramethyl-3,5-heptanedionato) (1,5-cyclooctadiene)ruthenium(II). In preferred embodiments, the precursor is bis(ethylcyclopentadienyl) ruthenium (Ru [EtCp]$_2$). Examples of ruthenium precursors include, but are not limited to, bis(ethylcyclopentadienyl)ruthenium (Ru (EtCp)$_2$), C$_6$H$_8$Ru(CO)$_3$, ruthenium octanedionate (Ru(OD)$_3$), bis(cyclopentadienyl)ruthenium (Ru(Cp)$_2$), RuO$_4$, and ruthenium tetramethylheptadionate (Ru(thd)$_3$). In one embodiment, an organometallic Ru precursor, particularly C$_6$H$_8$Ru(CO)$_3$, may be used as a ruthenium precursor.

The film or layer is "thin" in that it has a thickness less than or equal to 5 nm with some embodiments of method 100 depositing a layer of noble metal in the range of 1 to 5 nm. A variety of noble metals may be deposited in step 130 to form the electrode liner, with iridium being desirable in some exemplary applications with its work function of 5.27 eV and its low oxygen scavenging potential among the noble metals working to provide a scavenging barrier and alter the effective work function of the electrode formed in step 120. In other cases, a noble metal may be selected with a work function greater than about 5 eV. In some implementations of the method 100, the metal deposited in step 130 (and/or step 150) is iridium (Ir), ruthenium (Ru), platinum (Pt), or other noble metal.

The method 100 continues with step 140 with forming an insulator or dielectric layer on or over the exposed, upper surface of the liner formed in step 130. Again, any useful and well-known deposition technology may be used for step 140. Suitably, step 140 can include forming a metal oxide containing layer by means of an ALD processes. Suitable ALD processes include a sequence of exposing the substrate to a metal precursor, exposing the substrate to a purge gas, exposing the substrate to an oxygen reactant, and exposing the substrate to a purge gas. Suitable metal precursors include metalorganic precursors and halides, and are known as such in the art. Suitable oxygen reactants include oxygen-containing gasses such as O$_2$, O$_3$, H$_2$O, and H$_2$O$_2$. The dielectric layer may be formed by a process that includes depositing a high-k or ultra-high k dielectric material such as hafnium oxide (HfO$_2$), doped HfO$_2$, hafnium zirconium oxide (HfZrO), doped HfZrO, or the like. In some cases, the dielectric layer comprises a high-k metal oxide material such as titanium oxide, zirconium oxide, aluminum oxide, barium-strontium-titanate, erbium oxide, hafnium silicate, lanthanum oxide, niobium oxide, lead-zirconium-titanate, strontium titanate, tantalum oxide, titanium oxide, zirconium oxide, or other high-k or ultra-high-k metal oxide (e.g., with k-values greater than about 40).

Next, step 150 of method 100 includes forming a thin layer or film that acts as a liner for top or second electrode to be later formed in step 160 (e.g., forming another electrode liner). This may involve depositing, with PVD, ALD, or another useful deposition technology, a layer or film of a noble metal over the upper or exposed surface of the dielectric layer from step 140. In some embodiments, ALD is utilized to make use of its advantages that include: (a) better conformality, i.e. even layer thickness everywhere, even on sidewalls; and (b) ALD is essential for 3D RAM structures in which the capacitors are stacked sideways on top of each other, whereas PVD, which is a line-of-sight deposition technique, is useless for making such structures. As with the film formed in step 130, the film or layer is "thin" in that it has a thickness less than or equal to 5 nm with some embodiments of method 100 depositing a layer of noble metal in the range of 0.5 to 5 nm. The thickness of the second liner formed in step 150 may be equal to or differ from that of the liner formed instep 130 to achieve desired results in a particular application (e.g., a desired overall work function or scavenging barrier). A variety of noble metals may be deposited in step 150 to form the top or second electrode liner, and the same noble metal may be used for the two liners or the noble material may differ to suit a particular MIM capacitor design. In some cases, though, iridium is used for the top or second liner due to its work function of 5.27 eV and its low oxygen scavenging potential among the noble metals working to provide a scavenging barrier and alter the effective work function of the electrode formed in later step 160. In other cases, a noble metal may be selected with a work function greater than about 5 eV. In some implementations of the method 100, the metal deposited in step 150 is iridium (Ir), ruthenium (Ru), platinum (Pt), or other noble metal.

The method 100 then includes at step 160 forming a second or top electrode layer above or on an upper surface of the liner from step 150. In one embodiment, the electrode is formed by depositing a thin film of a metal (such as titanium nitride (TiN)) through one of the deposition processes described above. The metal layer or element providing the top or second electrode may be formed of other metals, conductive metal oxides, conductive metal silicides, conductive metal nitrides, and combinations thereof. The metal deposited in step 160 to form the thin film providing the top or second electrode may be the same or differ from that deposited in step 120 to form the first or bottom electrode. The method 100 may include additional steps (not shown). For example, in the case of etching the electrodes, the electrode conductive material (e.g., a metal) can be etched as usual, i.e., using an etch chemistry adapted for etching the bulk electrode, and the liner can act as an etch stop layer. Then, a short, and different in some cases, etch cycle can be used to punch through the liner as part of the capacitor fabrication.

Figure 2:
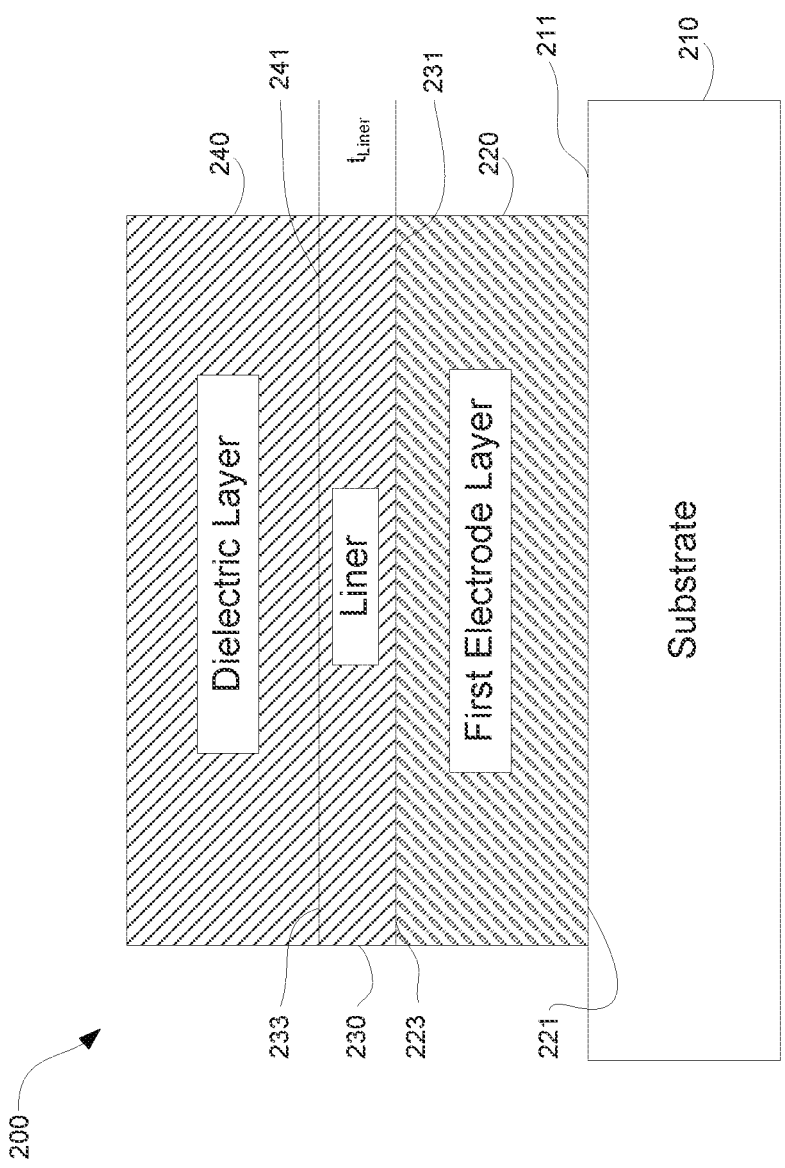
FIG. 2 illustrates a simplified cross-sectional view of a portion of a MIM capacitor fabricated in accordance with some embodiments of the present description such as with the method of FIG. 1.

FIG. 2 illustrates a simplified cross-sectional view of a portion of a MIM capacitor or capacitor stack 200 fabricated in accordance with some embodiments of the present description such as with the method 100 of FIG. 1. As shown, a first electrode layer 220 is formed above a substrate 210. Using the method 100 of FIG. 1, a metal (or other conductive material) film or layer (e.g., a thickness of TiN or other another conductive material useful in forming capacitor electrodes) is deposited upon the upper surface 211 of the substrate 210 such that lower side or surface 220 of the electrode layer 220 abuts or is in contact with the substrate's upper surface 211.

In a next fabrication step, a layer of a noble metal is deposited to form a liner 230 over the first electrode layer 220. The liner may be formed of iridium (Ir), ruthenium (Ru), platinum (Pt), or other noble metal The liner 230 is thin with a thickness, tuner, of less than or equal to 5 nm such as in the range of 0.5 to 5 nm, and is formed to provide a cap over the electrode 220 with its first or lower surface 231 covering the upper side or surface 223 of the electrode layer 220. The stack 200 further includes a dielectric layer 240 that is provided or deposited on a second or upper side or surface 233 of the liner 230 such that the lower side or surface 241 of the dielectric mates with or abuts this liner surface 233. Stated differently, the liner 230 is sandwiched, in the capacitor stack 200, between the electrode 220 and the dielectric 240.

Figure 3:
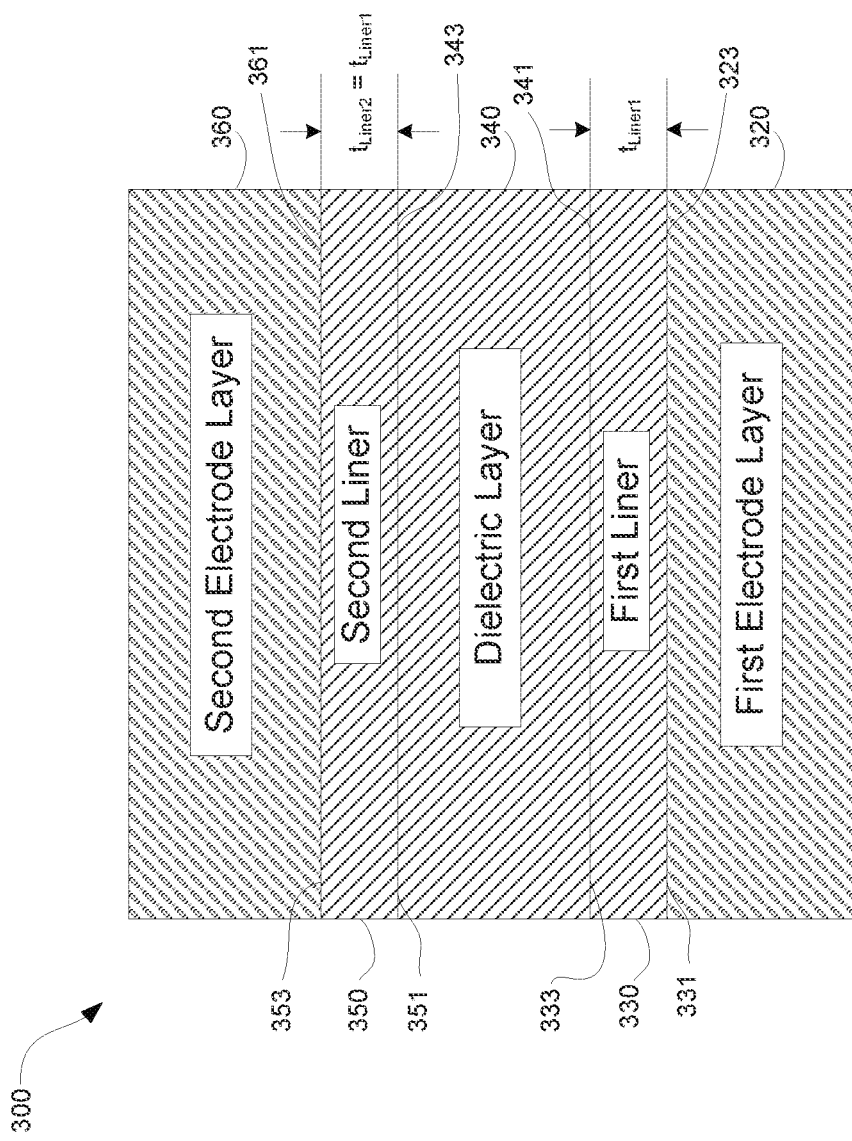
FIG. 3 illustrates a simplified cross-sectional view of another exemplary MIM capacitor fabricated in accordance with some embodiments of the present description such as with the method of FIG. 1 to have a pair of similarly fabricated electrode liners.

FIG. 3 illustrates a simplified cross-sectional view of a MIM capacitor or capacitor stack 300 fabricated in accordance with some embodiments of the present description such as with the method 100 of FIG. 1. As shown, a first electrode layer 320 is formed or provided, e.g., as a conductive material (e.g., a metal) film or layer (e.g., a thickness of TiN or other conductive material useful in forming capacitor electrodes) that may be deposited upon a substrate.

In a next fabrication step, a layer of a noble metal is deposited to form a liner 330 over the first electrode layer 320. The liner 330 may be formed of iridium (Ir), ruthenium (Ru), platinum (Pt), or other noble metal The liner 330 is thin with a thickness, $t_{Liner1}$, greater than zero and less than or equal to 5 nm such as in the range of 0.5 to 5 nm, and is formed to provide a cap over the electrode 320 with its first or lower surface 331 covering the upper side or surface 323 of the electrode layer 320. The stack 300 further includes a dielectric layer 340 that is provided or deposited on a second or upper side or surface 333 of the liner 330 such that the lower side or surface 341 of the dielectric mates with or abuts this liner surface 333. Stated differently, the first liner 330 is sandwiched, in the capacitor stack 300, between the first electrode 320 and the dielectric 340.

In a next fabrication step, a layer of a noble metal is deposited to form a second liner 350 over the dielectric 340 to provide a cap or barrier a second electrode layer or electrode 360. The liner 350 may be formed of iridium (Ir), ruthenium (Ru), platinum (Pt), or other noble metal. The liner 330 is thin with a thickness, $t_{Liner2}$, of less than or equal to 5 nm such as in the range of 0.5 to 5 nm, and is formed with its first or lower surface 351 covering the upper side or surface 343 of the dielectric 340. As shown, the second liner 350 is formed of the same noble metal as the first liner 330 and with a matching or nearly matching thickness (i.e., $t_{Liner1}=t_{Liner2}$), with "equal" being within 10 percent and more preferably within 5 percent of the same thickness.

The MIM capacitor or capacitor stack 300 further includes a second electrode layer 360 that is formed of a thin film or layer of a conductive material (such as TiN or another useful conductive material or metal as discussed above). The electrode layer 360 may be formed of the same metal as that of the first electrode layer or be formed of a differing metal to suit a particular MIM capacitor design. Likewise, the thicknesses of these two layers 320 and 360 may be equal (or substantially so) or differ to implement the stack/capacitor 300. The layer 360 is deposited with its lower surface or side 361 abutting or mating with the upper surface or side 353 of the second liner 350, whereby the liner 350 caps the electrode 360 and acts as a scavenging barrier as the liner 350 is sandwiched between the dielectric 340 and the electrode 360.

Figure 4:
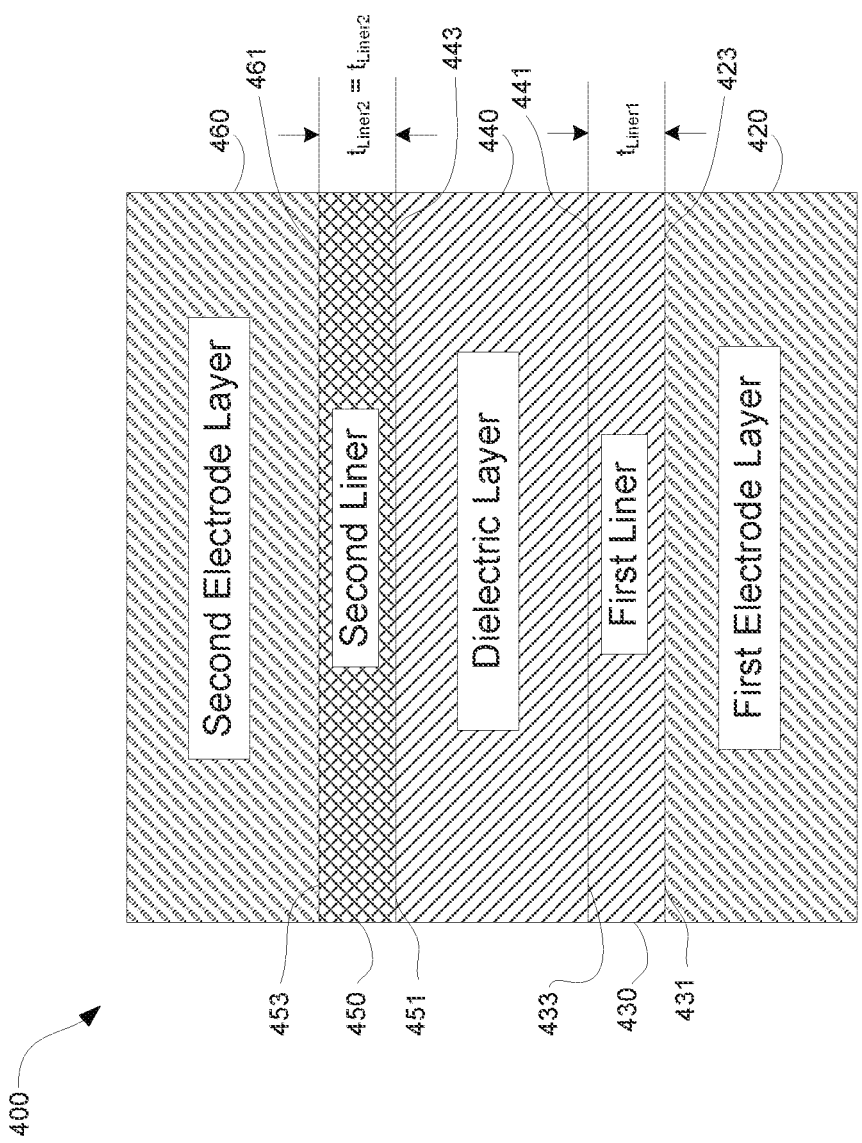
FIG. 4 illustrates a simplified cross-sectional view of an additional exemplary MIM capacitor fabricated in accordance with some embodiments of the present description such as with the method of FIG. 1 to have a pair of electrode liners formed of differing noble metals.

FIG. 4 illustrates a simplified cross-sectional view of a MIM capacitor or capacitor stack 400 fabricated in accordance with some embodiments of the present description such as with the method 100 of FIG. 1. As shown, a first electrode layer 420 is formed or provided, e.g., as a conductive material or metal film (or layer) (e.g., a thickness of TiN or other another conductive material useful in forming capacitor electrodes) that may be deposited upon a substrate (as shown in FIG. 2).

In a next fabrication step, a layer of a noble metal is deposited to form a liner 430 over the first electrode layer 420. The liner 430 may be formed of iridium (Ir), ruthenium (Ru), platinum (Pt), or other noble metal. The liner 430 is thin with a thickness, $t_{Liner1}$, of less than or equal to 5 nm such as in the range of 0.5 to 5 nm, and is formed to provide a cap over the electrode 420 with its first or lower surface 431 covering the upper side or surface 423 of the electrode layer 420. The stack 400 further includes a dielectric layer 440 that is provided or deposited on a second or upper side or surface 433 of the liner 430 such that the lower side or surface 441 of the dielectric mates with or abuts this liner surface 433. Stated differently, the first liner 430 is sandwiched, in the capacitor stack 400, between the first electrode 420 and the dielectric 440.

In a next fabrication step, a layer of a noble metal is deposited to form a second liner 450 over the dielectric 440 to provide a cap or barrier a second electrode layer or electrode 460. The liner 450 may be formed of a different noble metal than that of the liner 430 such as iridium (Ir), ruthenium (Ru), platinum (Pt), or other noble metal, e.g., the first liner 430 may be formed of Ir while the second is formed of Ru or Pt (or vice versa). In some embodiments, the liner 450 and the liner 430 are made of identical materials. The liner 430 is thin with a thickness, $t_{Liner2}$, of greater than zero and less than or equal to 5 nm such as in the range of 0.5 to 5 nm, and is formed with its first or lower surface 451 covering the upper side or surface 443 of the dielectric 440. As shown, the second liner 450 is formed with a matching or nearly matching thickness (i.e., $t_{Liner1}=t_{Liner2}$), but this is not required as discussed with regard to the stack 500 in FIG. 5.

The MIM capacitor or capacitor stack 400 further includes a second electrode layer 460 that is formed of a thin film or layer of a conductive metal (such as TiN or another useful metal as discussed above). The electrode layer 460 may be formed of the same conductive material or metal as that of the first electrode layer or be formed of a differing metal to suit a particular MIM capacitor design. Likewise, the thicknesses of these two layers 420 and 460 may be equal (or substantially so) or differ to implement the stack/capacitor 400. The layer 460 is deposited with its lower surface or side 461 abutting or mating with the upper surface or side 453 of the second liner 450, whereby the liner 450 caps the electrode 460 and acts as a scavenging barrier.

Figure 5:
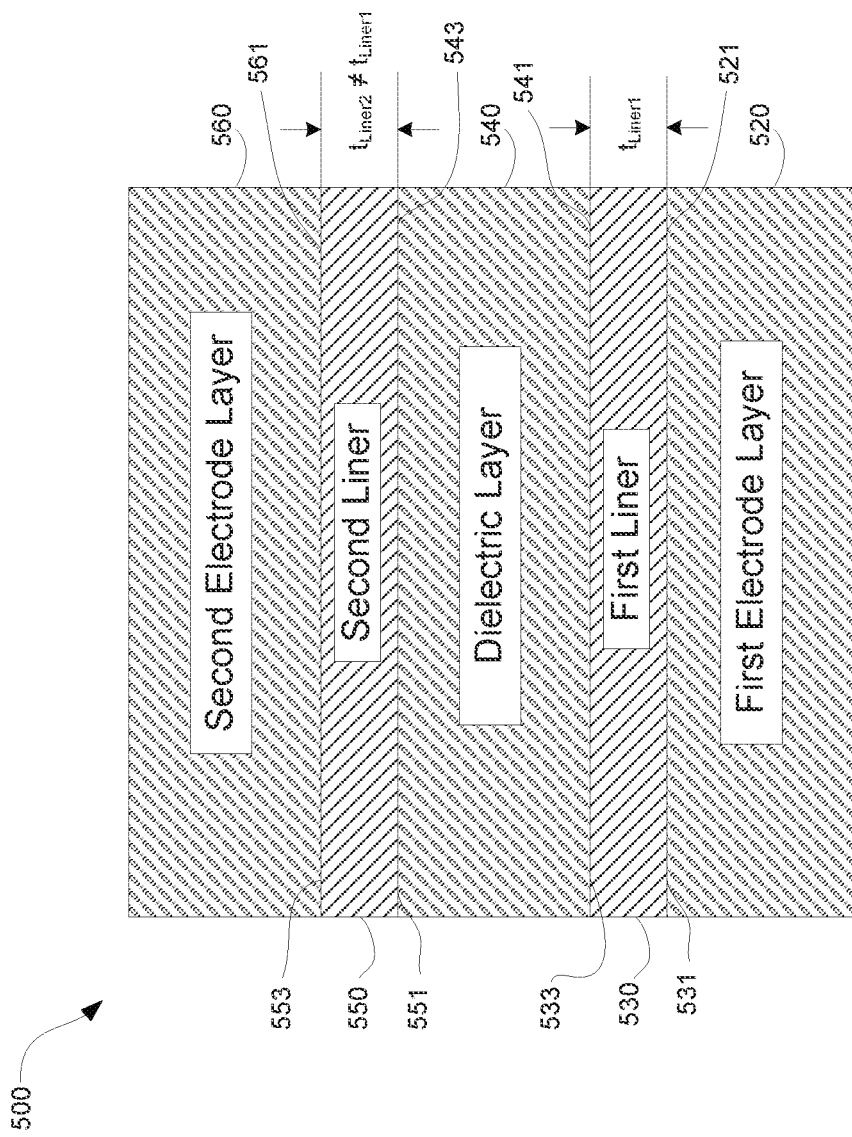
FIG. 5 illustrates a simplified cross-sectional view of another exemplary MIM capacitor fabricated in accordance with some embodiments of the present description such as with the method of FIG. 1 to have a pair of electrode liners formed with differing thicknesses.

FIG. 5 illustrates a simplified cross-sectional view of a MIM capacitor or capacitor stack 500 fabricated in accordance with some embodiments of the present description such as with the method 100 of FIG. 1. As shown, a first electrode layer 520 is formed or provided, e.g., as a conductive material or metal film or layer (e.g., a thickness of TiN or other another metal useful in forming capacitor electrodes) that may be deposited upon a substrate.

In a next fabrication step, a layer of a noble metal is deposited to form a liner 530 over the first electrode layer 520. The liner 530 may be formed of iridium (Ir), ruthenium (Ru), platinum (Pt), or other noble metal The liner 530 is thin with a thickness, $t_{Liner1}$, of less than or equal to 5 nm such as in the range of 0.5 to 5 nm, and is formed to provide a cap over the electrode 520 with its first or lower surface 531 covering the upper side or surface 523 of the electrode layer 520. The stack 500 further includes a dielectric layer 540 that is provided or deposited on a second or upper side or surface 533 of the liner 530 such that the lower side or surface 541 of the dielectric mates with or abuts this liner surface 533. Stated differently, the first liner 530 is sandwiched, in the capacitor stack 500, between the first electrode 520 and the dielectric 540.

In a next fabrication step, a layer of a noble metal is deposited to form a second liner 550 over the dielectric 540 to provide a cap or barrier a second electrode layer or electrode 560. The liner 550 may be formed of iridium (Ir), ruthenium (Ru), platinum (Pt), or other noble metal The liner 550 is thin with a thickness, $t_{Liner2}$, of less than or equal to 5 nm such as in the range of 0.5 to 5 nm, and is formed with its first or lower surface 551 covering the upper side or surface 543 of the dielectric 540. As shown, the second liner 550 is formed of the same noble metal as the first liner 530 but with a thickness, $t_{Liner2}$, that is greater or less than the thickness, $t_{Liner1}$, of the first liner 530 (i.e., $t_{Liner1}$ does not equal $t_{Liner2}$), with "not equal" typically meaning a difference of more than 10 percent and, often, more than 20 percent difference.

The MIM capacitor or capacitor stack 500 further includes a second electrode layer 560 that is formed of a thin film or layer of a conductive material or a metal (such as TiN or another useful conductive material as discussed above). The electrode layer 560 may be formed of the same material as that of the first electrode layer or be formed of a differing material to suit a particular MIM capacitor design. Likewise, the thicknesses of these two layers 520 and 560 may be equal (or substantially so) or differ to implement the stack/capacitor 500. The layer 560 is deposited with its lower surface or side 561 abutting or mating with the upper surface or side 553 of the second liner 550, whereby the liner 550 caps the electrode 560 and acts as a scavenging barrier.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A method of fabricating a semiconductor stack for use in metal-insulator-metal (MIM) capacitors, comprising:
providing a first electrode layer comprising a layer of a first conductive material;
forming a first liner by depositing a layer of a first noble metal on the first electrode layer;
forming a dielectric layer on the first liner, whereby the first liner is sandwiched between the first electrode layer and the dielectric layer;
forming a second liner by depositing a layer of a second noble metal on a surface of dielectric layer opposite the first liner; and
forming a second electrode layer by depositing a layer of a second conductive material on a surface of the second liner opposite the dielectric layer.

2. The method of claim 1, wherein the first noble metal differs from the second noble metal.

3. The method of claim 1, wherein the first liner has a first thickness and the second liner has a second thickness differing from the first thickness.

4. The method of claim 1, wherein the first and second liners each has a thickness greater than zero and less than or equal to 5 nanometers (nm).

5. The method of claim 1, wherein the dielectric layer comprises a layer of a high-k or ultra-high-k dielectric material.

6. The method of claim 5, wherein the layer of a high-k or ultra-high-k dielectric material comprises at least one of hafnium oxide ($HfO_2$), doped $HfO_2$, hafnium zirconium oxide (HfZrO), and doped HfZrO.

7. The method of claim 1, wherein the first and second conductive materials are each a conductive metal, a conductive metal oxide, a conductive metal silicide, a conductive metal nitrides, or a combination thereof.

8. The method of claim 1, wherein the forming of the first liner and the forming of the second liner each comprises a cyclical deposition process including a plurality of cycles, wherein each of the cycles comprises a precursor pulse and a reactant pulse, wherein the precursor pulse comprises exposing the substrate to a precursor, and wherein the reactant pulse comprises exposing the substrate to a reactant.

9. A method of fabricating a semiconductor stack for use in metal-insulator-metal (MIM) capacitors, comprising:
providing a substrate;
forming an electrode layer by depositing a layer of a conductive metal on the substrate;
after the forming of the electrode layer, forming a liner by depositing a layer of a metal over the electrode layer, wherein the metal of the liner differs from the conductive metal, wherein the liner has a thickness less than or equal to 5 nm, and wherein the metal has a work function of at least 5 eV; and
after the deposition of the layer of the metal, forming a dielectric layer on the layer of the metal, wherein the liner is sandwiched between the electrode layer and the dielectric layer and wherein the dielectric layer comprises a high-k or ultra-high-k dielectric material.

10. The method of claim 9, wherein the thickness is in the range of about 0.5 nm to about 5 nm and wherein the metal of the liner is a noble metal.

11. The method of claim 9, wherein the high-k or ultra-high-k dielectric material is hafnium oxide ($HfO_2$), doped $HfO_2$, hafnium zirconium oxide (HfZrO), or doped HfZrO.

* * * * *